United States Patent
Liu et al.

(10) Patent No.: US 9,263,338 B2
(45) Date of Patent: Feb. 16, 2016

(54) SEMICONDUCTOR DEVICE INCLUDING VERTICALLY SPACED SEMICONDUCTOR CHANNEL STRUCTURES AND RELATED METHODS

(71) Applicants: STMicroelectronics, Inc., Coppell, TX (US); GLOBALFOUNDRIES INC., Cayman Islands (KY)

(72) Inventors: Qing Liu, Guilderland, NY (US); Xiuyu Cai, Niskayuna, NY (US); Ruilong Xie, Schenectady, NY (US)

(73) Assignees: STMICROELECTRONICS, INC., Coppell, TX (US); GLOBALFOUNDRIES INC., Grand Cayman (KY)

( * ) Notice: Subject to any disclaimer, the term of this patent is extended or adjusted under 35 U.S.C. 154(b) by 23 days.

(21) Appl. No.: 14/060,874

(22) Filed: Oct. 23, 2013

(65) Prior Publication Data
US 2015/0108573 A1    Apr. 23, 2015

(51) Int. Cl.
*H01L 21/00* (2006.01)
*H01L 21/8234* (2006.01)
*H01L 27/088* (2006.01)

(52) U.S. Cl.
CPC ..... *H01L 21/823412* (2013.01); *H01L 21/823431* (2013.01); *H01L 21/823481* (2013.01); *H01L 21/823487* (2013.01); *H01L 27/0886* (2013.01)

(58) Field of Classification Search
CPC ............ H01L 51/5012; H01L 51/0072; H01L 51/0067; H01L 51/5072; H01L 51/5206
USPC ............ 438/155, 300; 257/E21.619, E21.634
See application file for complete search history.

(56) References Cited

U.S. PATENT DOCUMENTS

| | | | |
|---|---|---|---|
| 8,310,013 | B2 | 11/2012 | Lin et al. |
| 2012/0064682 | A1* | 3/2012 | Jang et al. ............ 438/268 |
| 2013/0341704 | A1* | 12/2013 | Rachmady et al. ........ 257/327 |

OTHER PUBLICATIONS

U.S. Appl. No. 13/906,702, filed May 31, 2013.

* cited by examiner

*Primary Examiner* — Andy Huynh
(74) *Attorney, Agent, or Firm* — Allen, Dyer, Doppelt, Milbrath & Gilchrist, P.A.

(57) ABSTRACT

A method for making a semiconductor device may include forming, on a substrate, at least one stack of alternating first and second semiconductor layers. The first semiconductor layer may comprise a first semiconductor material and the second semiconductor layer may comprise a second semiconductor material. The first semiconductor material may be selectively etchable with respect to the second semiconductor material. The method may further include removing portions of the at least one stack and substrate to define exposed sidewalls thereof, forming respective spacers on the exposed sidewalls, etching recesses through the at least one stack and substrate to define a plurality of spaced apart pillars, selectively etching the first semiconductor material from the plurality of pillars leaving second semiconductor material structures supported at opposing ends by respective spacers, and forming at least one gate adjacent the second semiconductor material structures.

18 Claims, 13 Drawing Sheets

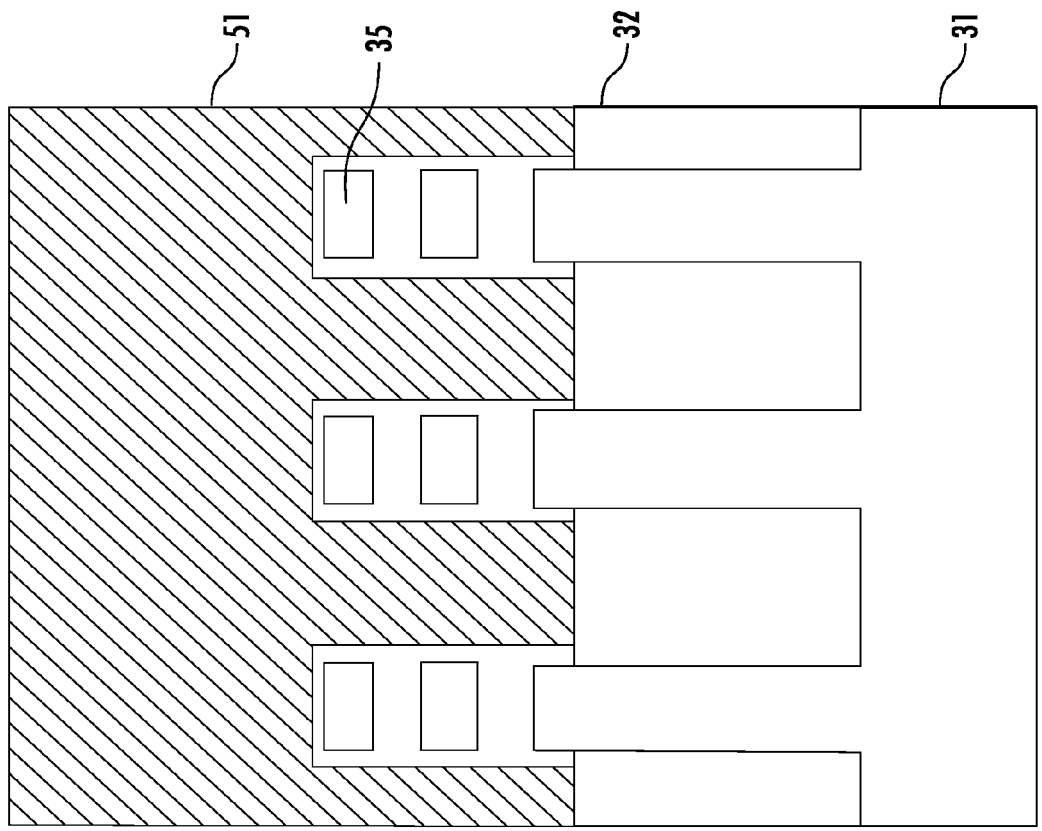
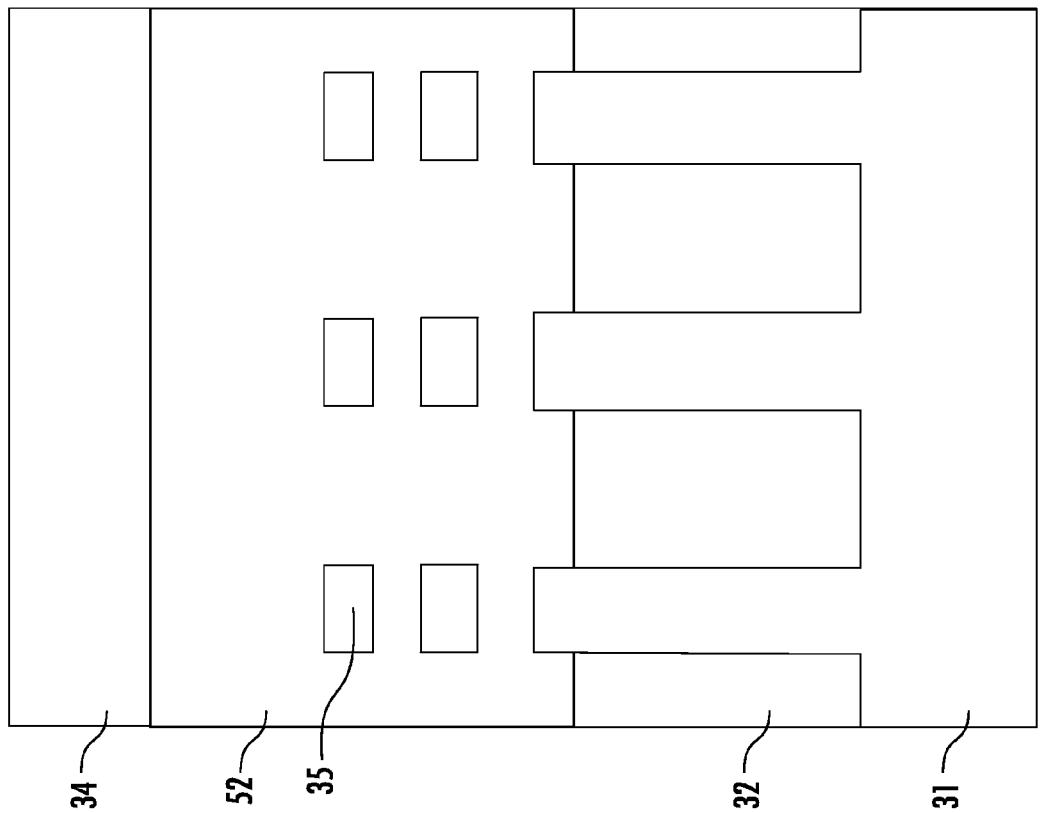

SEMICONDUCTOR DEVICE INCLUDING VERTICALLY SPACED SEMICONDUCTOR CHANNEL STRUCTURES AND RELATED METHODS

FIELD OF THE INVENTION

The present invention relates to the field of electronic devices and, more particularly, to semiconductor devices and related methods.

BACKGROUND OF THE INVENTION

Fin-based field effect transistors (FINFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

One example FINFET device is set forth in U.S. Pat. No. 8,310,013 to Lin et al., which is hereby incorporated herein in its entirety by reference. The FINFET device includes a substrate of a crystalline semiconductor material having a top surface of a first crystal plane orientation, a fin structure of the crystalline semiconductor material overlying the substrate, a gate structure over a portion of the fin structure, and an epitaxial layer over another portion of the fin structure. The epitaxial layer has a surface with a second crystal plane orientation. The epitaxial layer and underlying fin structure include a source and drain region. The source region is separated from the drain region by the gate structure. A. channel is defined in the fin structure from the source region to the drain region, and aligned in a direction parallel to both the surface of the epitaxial layer and the top surface of the substrate.

Despite the existence of such configurations, further enhancements in such devices may be desirable in some applications, particularly next generation devices with relatively small dimensions.

SUMMARY OF THE INVENTION

A method for making a semiconductor device may include forming, on a substrate, at least one stack of alternating first and second semiconductor layers. The first semiconductor layer may comprise a first semiconductor material and the second semiconductor layer may comprise a second semiconductor material. The first semiconductor material may be selectively etchable with respect to the second semiconductor material. The method may further include removing portions of the at least one stack and substrate to define exposed sidewalls thereof, forming respective spacers on the exposed sidewalls, etching a plurality of recesses through the at least one stack and substrate to define a plurality of spaced apart pillars, selectively etching the first semiconductor material from the plurality of pillars leaving second semiconductor material structures supported at opposing ends by respective spacers, and forming at least one gate adjacent the second semiconductor material structures.

More particularly, forming the at least one stack may comprise forming a plurality thereof. Furthermore, each of the second semiconductor material structures may have a vertical dimension of less than 10 nanometers. The method may further include filling at least a portion of the recesses with an oxide prior to selectively etching the first semiconductor material.

Forming the at least one gate may comprise forming an insulating layer adjacent the second semiconductor material, and forming a conductor layer adjacent the insulating layer. By way of example, forming the at least one gate may comprise forming at least one replacement metal gate (RMG).

Furthermore, etching may comprise forming a mask layer prior to forming the spacers, and removing portions of the mask layer where the recesses are to be etched. By way of example, the first semiconductor material may comprise silicon germanium, and the second semiconductor material may comprise silicon. Furthermore, the spacers may comprise at least one of a nitride and an oxide, and the substrate may comprise silicon, for example.

A related semiconductor device may include a substrate, spaced apart source and drain regions on the substrate, and a gate on the substrate between the source and drain regions. Furthermore, a plurality of groups of semiconductor material structures may extend between the source and drain regions and through the gate, with the semiconductor material structures within each group being vertically spaced apart from one another.

BRIEF DESCRIPTION OF THE DRAWINGS

FIGS. 2a-10a are a series of top views illustrating a method of making the semiconductor device of FIG. 1.

FIGS. 2b-10b are a series of cross-sectional diagrams respectively corresponding to FIGS. 2a-10a.

FIGS. 13 and 14 are cross-sectional diagrams of the finished source (or drain) and gate structures of FIG. 1, respectively.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As noted above, FINFET technology is evolving into ever smaller device dimensions. One structure which may help in the evolution of smaller FINFET devices, as well as other vertical and lateral semiconductor structures, is nanowires. Nanowires may be defined as structures that have a thickness or diameter constrained to tens of nanometers or less, and an unconstrained length. Semiconductor nanowires may be useful in future devices, including FINFETs and beyond, since nanowires may potentially provide enhanced electrostatic control, for example. However, with typical FINFET fabrication work flows, it may be difficult to integrate replacement metal gate (RMG) processes due to gate patterning issues, as they may not allow for patterning down to the nanowire level, for example.

Figure 1:
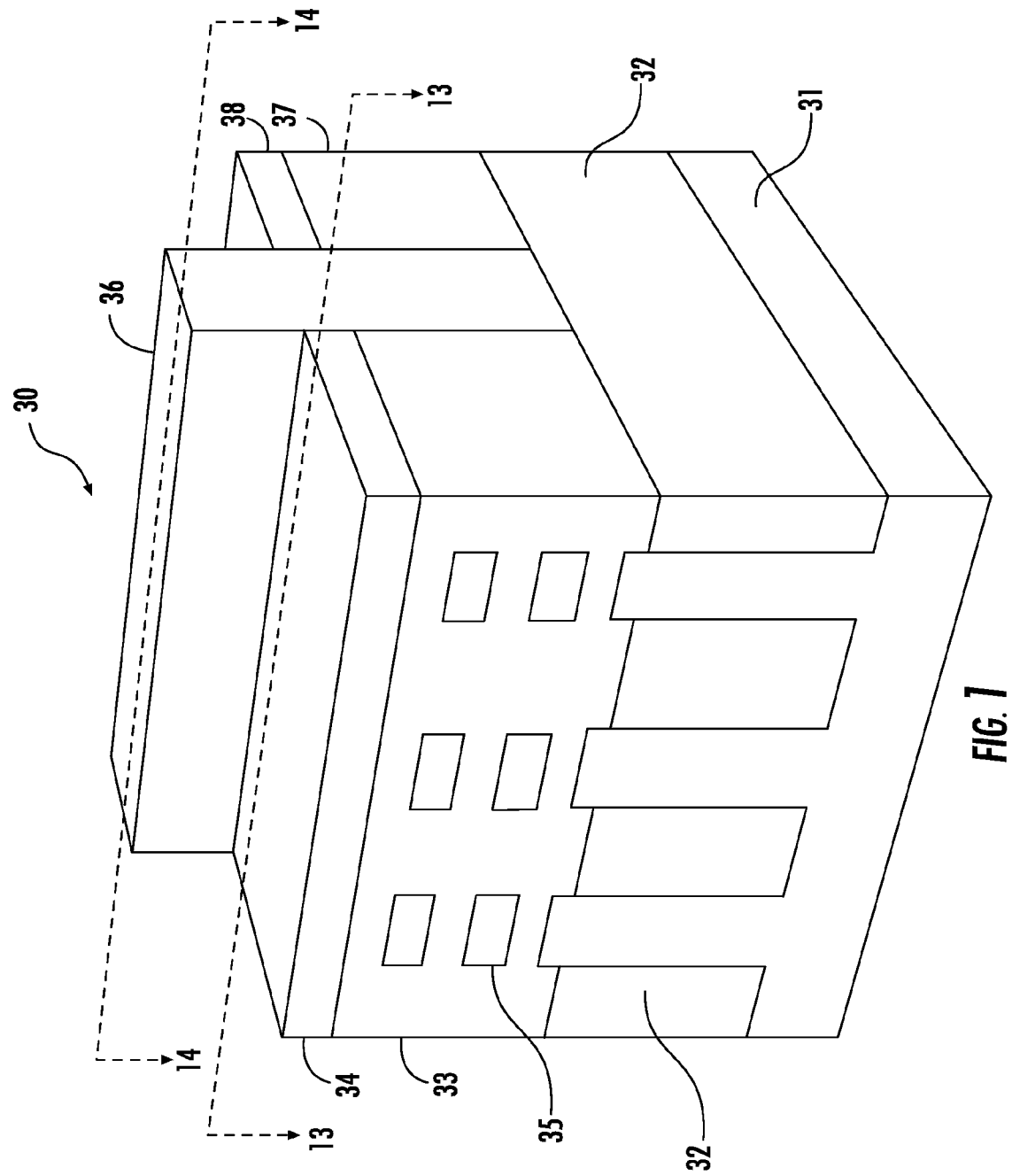
FIG. 1 is a perspective view of a semiconductor device in accordance with an example embodiment.

Turning now to FIG. 1, a semiconductor device 30 (here a FINFET) including nanowires in the source/drain and channel regions is first described. The semiconductor device 30 illustratively includes a substrate 31 (e.g., a silicon substrate), and a plurality of laterally spaced-apart oxide regions 32 in the substrate. A raised source region 33 has an interlayer dielectric (ILD) oxide layer 34 thereon, and a raised drain region 37 has an ILD oxide layer 38 thereon. A plurality of semiconductor structures or nanowires 35 extend through the raised source region 33 to the raised drain region 37, and pass through a gate 36 between the source and drain regions. Within the gate 36, the nanowires 35 provide the channel for the semiconductor device 30. The raised source region 33 and raised drain region 37, as well as the nanowires 35, may comprise epitaxial (i.e., single crystal) silicon, although other suitable materials may also be used in different embodiments.

Figure 2A:
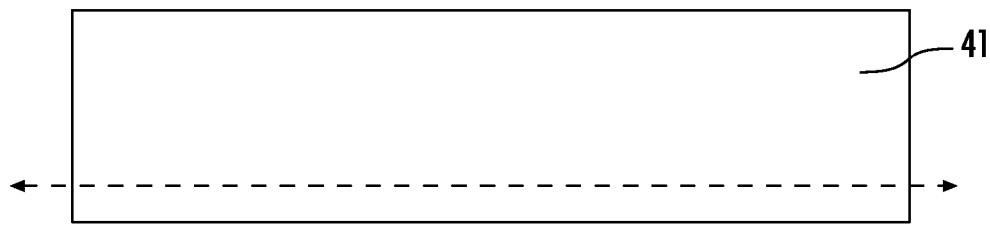
Figure 2B:
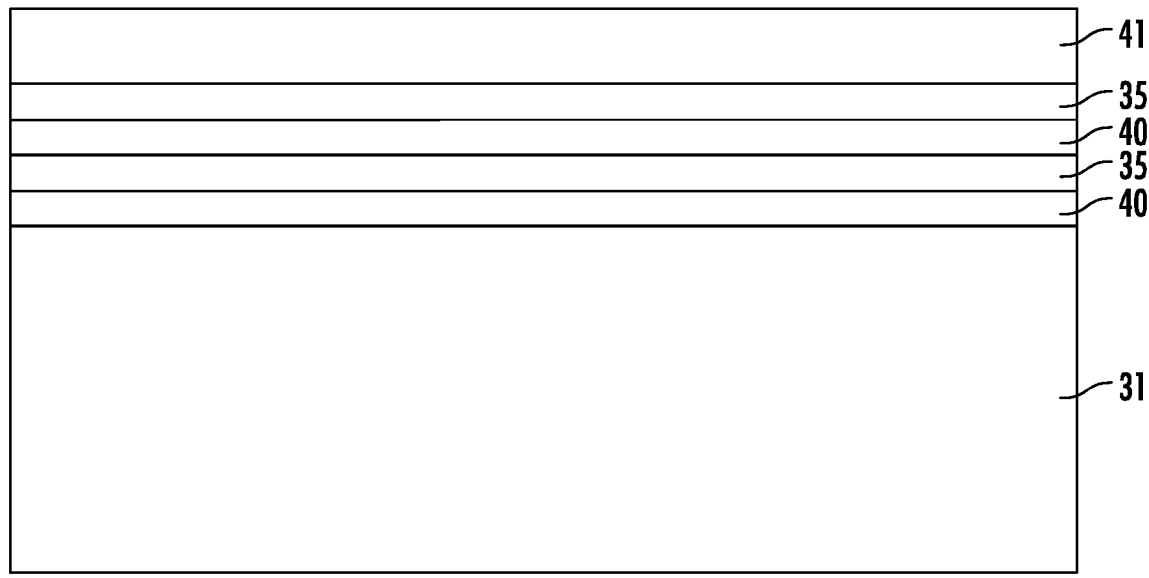

An example method for making the semiconductor device 30 is now described with reference to FIGS. 2a-14. The example approach may advantageously allow for integration of desired gate patterning processes, such as RMG, for example, while using traditional FINFET processing techniques. The method begins with alternatively forming epitaxial layers of SiGe 40 and Si 35, and a hard mask 41 (e.g. SiN, etc.) on top of the layers. Each pair of SiGe and Si layers 40, 35, may be considered as a stack, and one or more stacks may be used in a given embodiment. In the illustrated example, two stacks of alternating SiGe and Si layers 40, 35 are used (i.e., four total layers), as seen in FIG. 2b. SiGe is selectively etchable with respect to Si, which will allow portions of the SiGe layer 40 to be etched from underneath the Si layers 35 to define the nanowires, as will be discussed further below. However, it will be appreciated that other materials or configurations which allow for such selective etching may also be used in different embodiments. By way of example, the SiGe layers 40 may have a vertical height of approximately 10 nm or less, while the Si layer 35 may have a vertical height of approximately 6 nm, although other dimensions may be used in different embodiments.

Figure 3A:
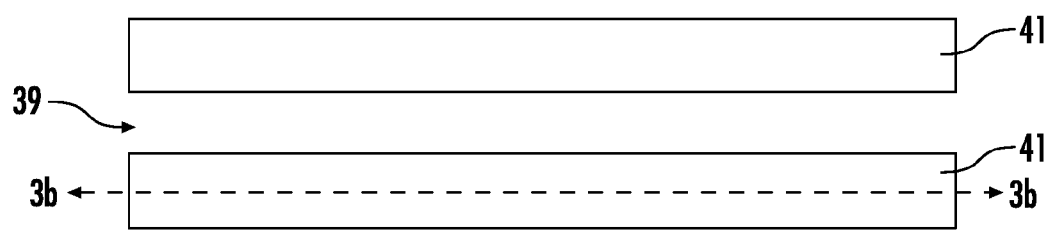
Figure 3B:
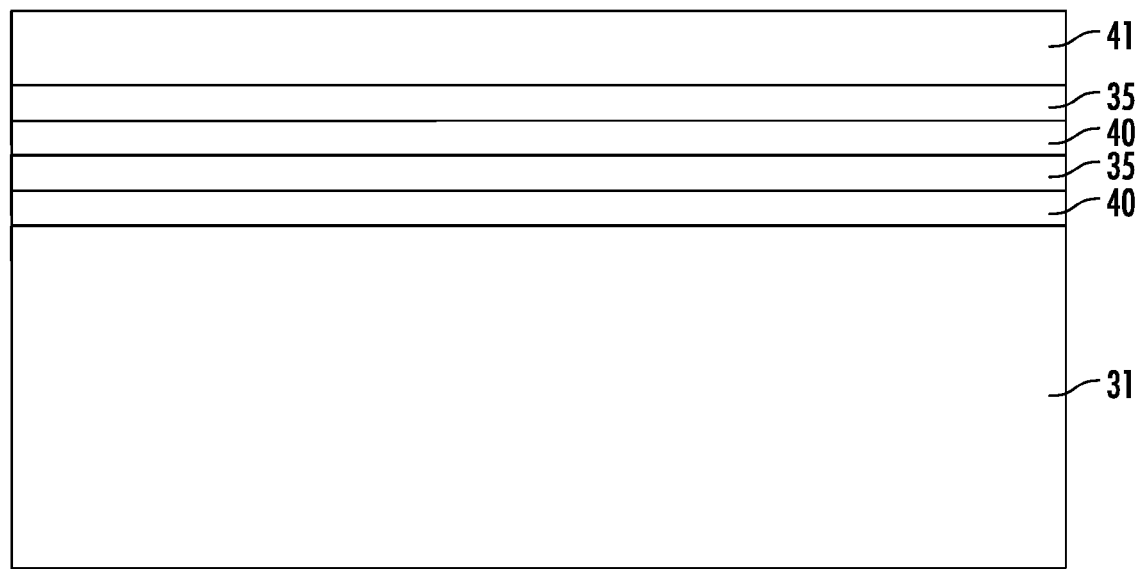
Figure 4A:
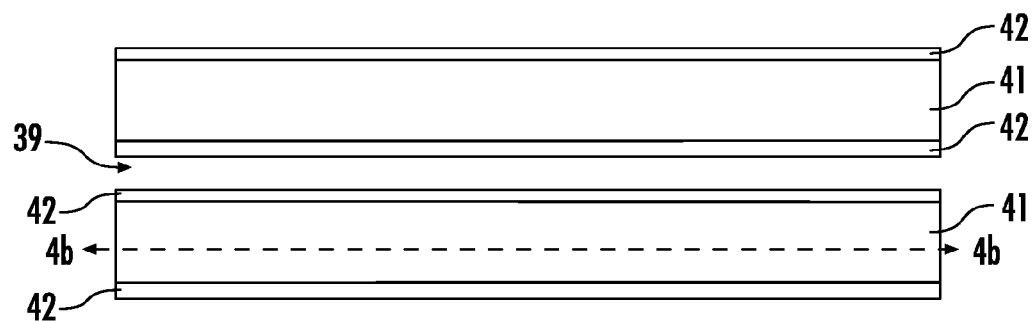
Figure 4B:
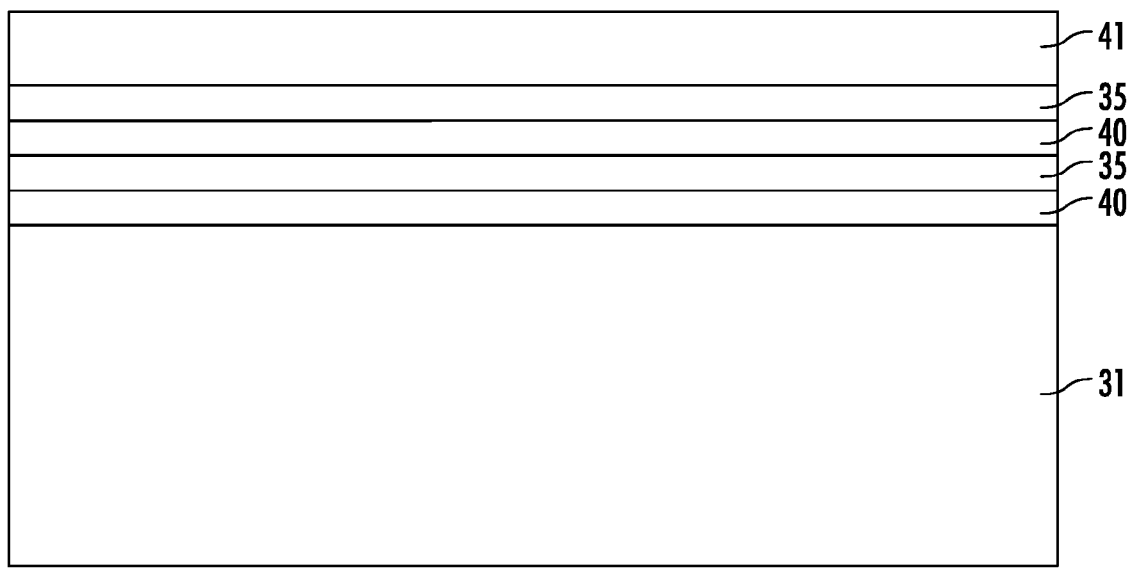

The method continues with removing portions of the stacks of SiGe and Si layers 40, 35, the substrate 31, and hard mask 41 to define exposed sidewalls thereof, as seen in FIG. 3a. In the illustrated example, a single trench 39 is formed (parallel to the line 3b-3b) to define two raised areas with sidewalls, but it will be appreciated that other trenches may be formed to define other raised areas on a wafer. It should be noted that the trench(es) 39 will be filled with the oxide 32 in subsequent steps to define shallow trench isolation (STI) regions for the semiconductor device 30, as will be appreciated by those skilled in the art. Once the trench(es) 39 are formed, respective spacers 42 may be formed on the exposed sidewalls, as seen in FIG. 4a. The spacers 42 will serve as an anchor to hold up the Si nanowires 35 during their formation, as will be further described below. By way of example, the spacers 42 may comprise a nitride (e.g., SiN), $Al_2O_3$, etc.

Figure 5A:
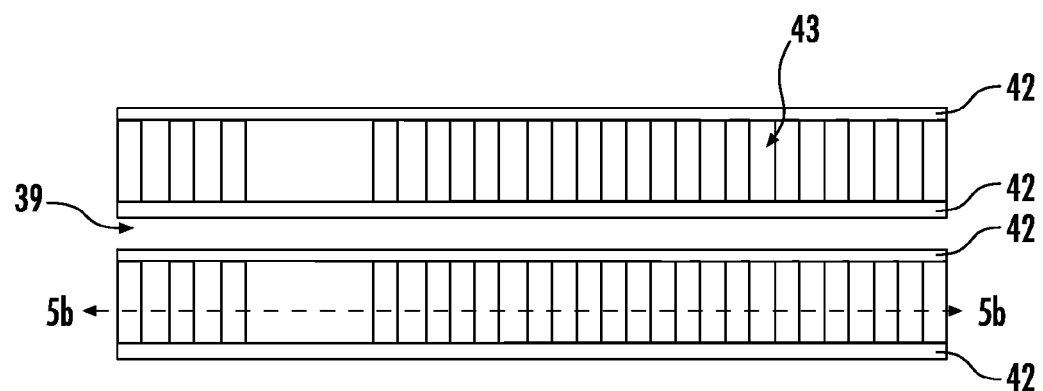
Figure 5B:
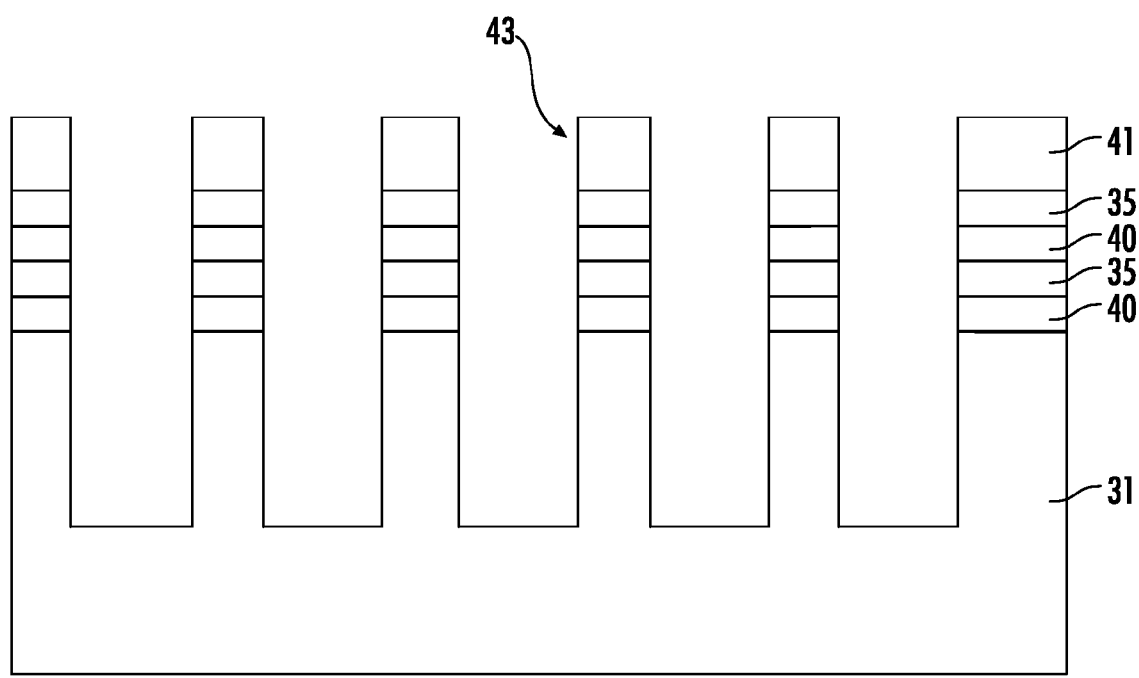

Next, portions of the hard mask 41 may be removed where a plurality of recesses are to be formed through the stacks of SiGe and Si layers 40, 35 and the substrate 31 to define a plurality of spaced apart pillars or fins 43, as seen in FIGS. 5a and 5b. This nitride removal may be performed by selective reactive ion etching (RIE), for example. It should be noted that the spacers 42 remain in place, as they are "shadowed" by the oxide 32 in the STI region during nitride hard mask RIE processing. As noted above, $Al_2O_3$, for example, may be used in place of nitride for the spacers 42, allowing both wet removal and RIE processes to be used to remove the nitride mask 41 as well.

Figure 6A:
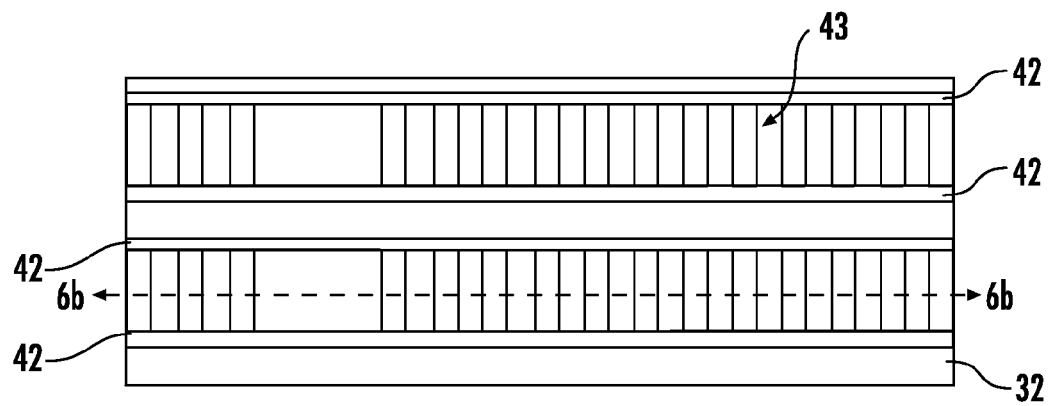
Figure 6B:
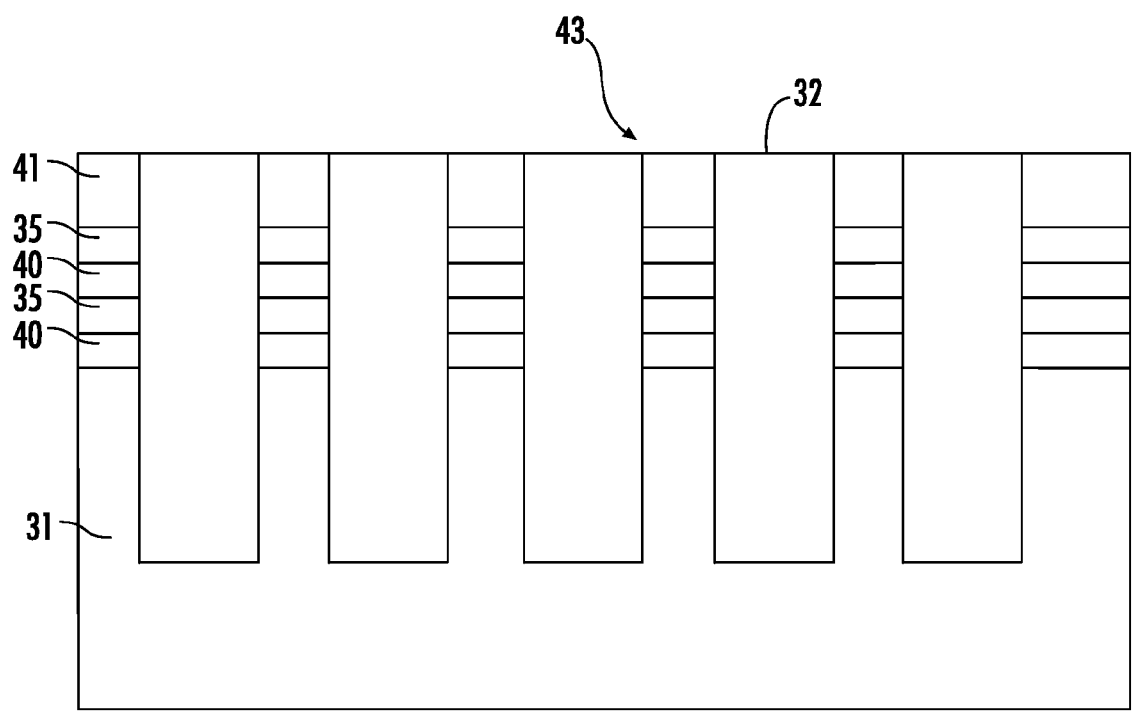
Figure 7A:
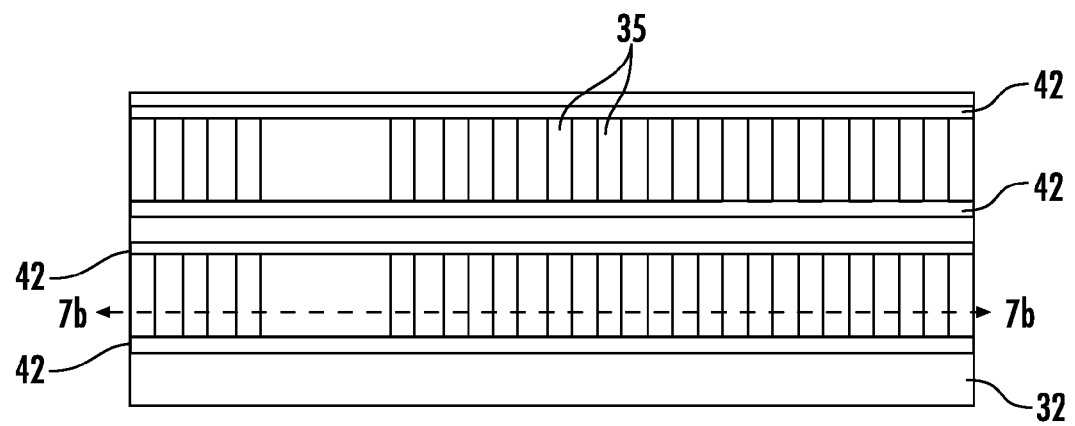
Figure 7B:
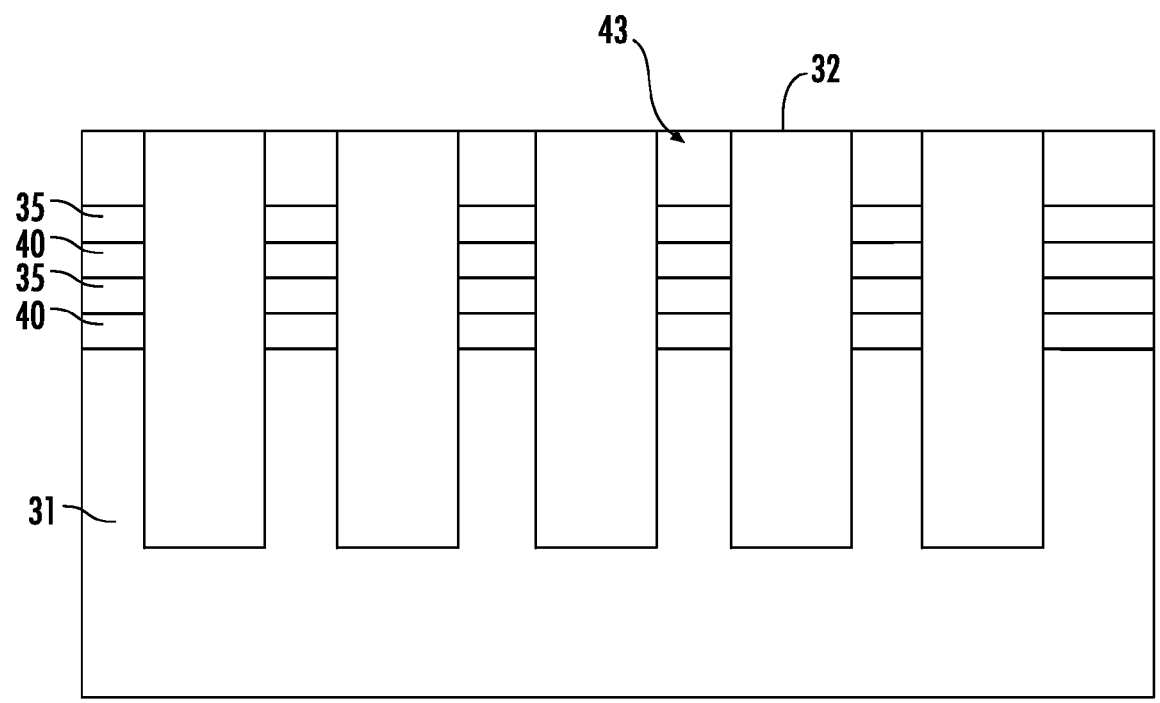

Etching of the fins 43 is performed along an axis perpendicular to the line 5b-5b in the illustrated example. An oxide 32 may then optionally be formed or filled between the fins 43, followed by a planarizing step (e.g., chemical-mechanical polishing, CMP), as shown in FIGS. 6a, 6b, and the remaining portions of the hard mask 41 may be removed (FIGS. 7a, 7b).

Figure 8A:
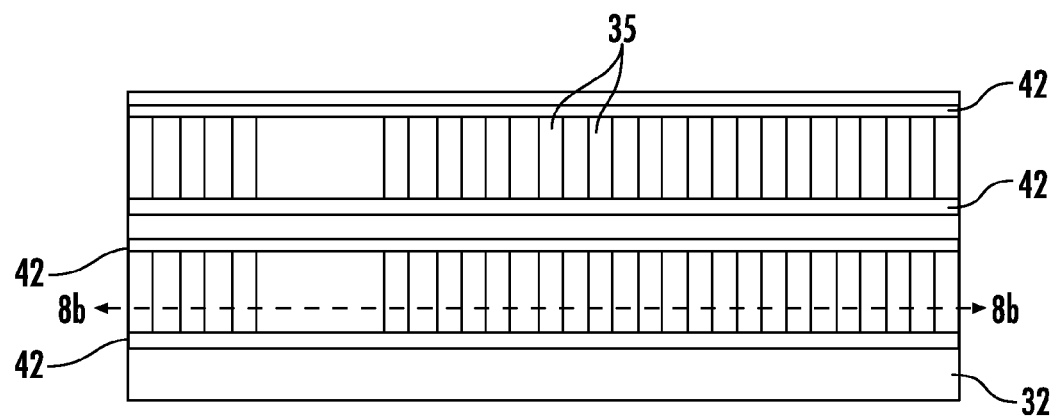
Figure 8B:
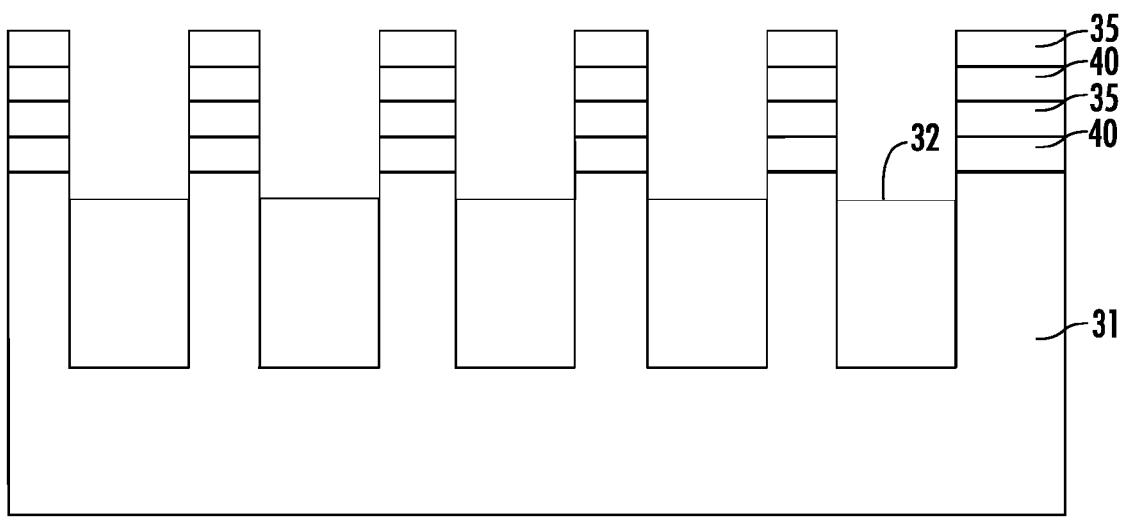
Figure 9A:
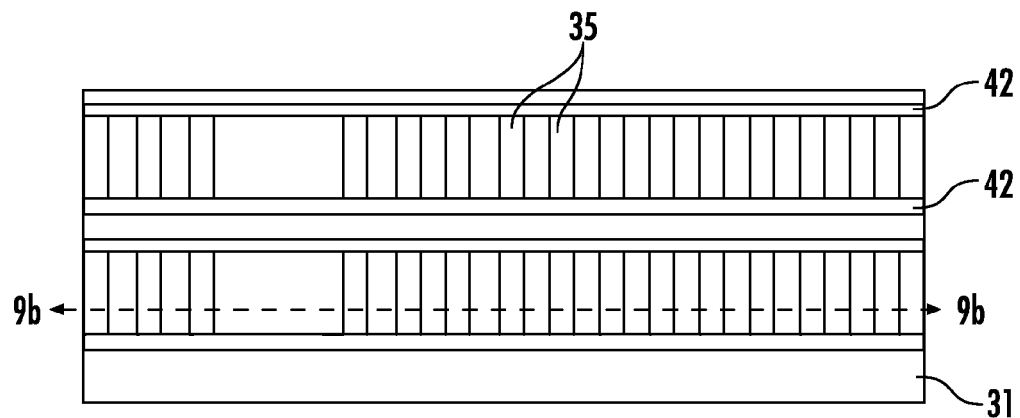
Figure 9B:
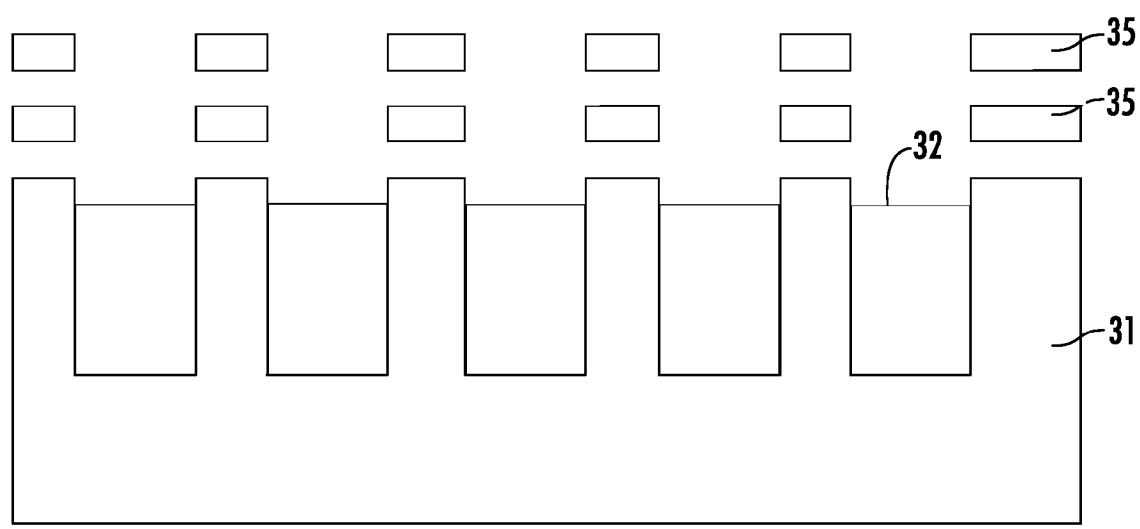
Figure 10A:
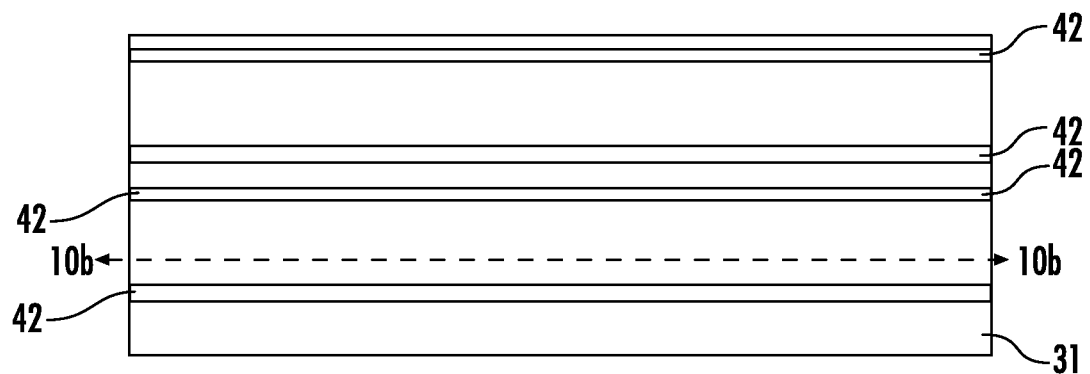
Figure 10B:
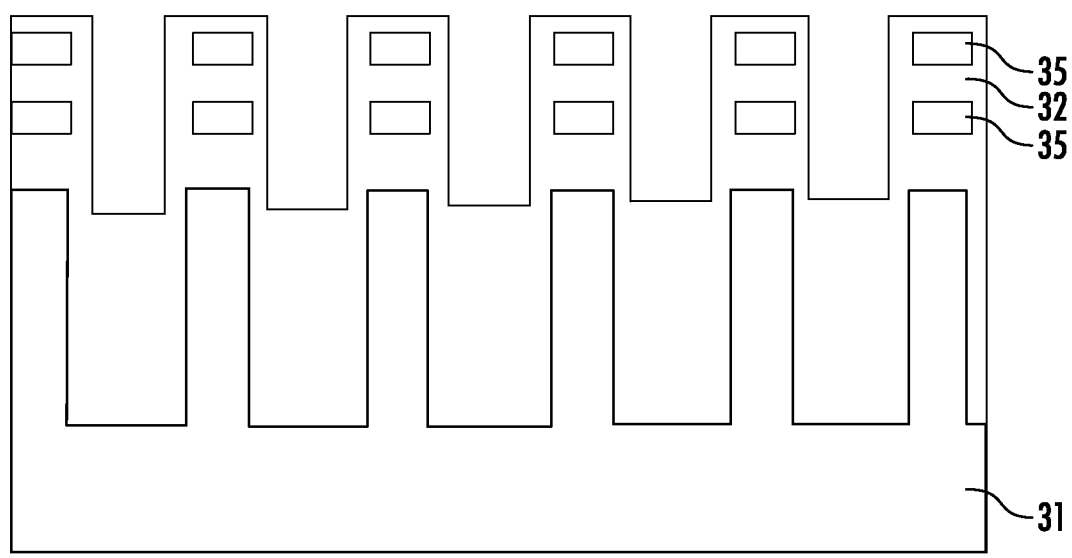

The oxide 32 may be further recessed, as shown in FIG. 8b, to allow for selectively etching of the remaining portions of the SiGe layers 40 away from the adjacent silicon to define the silicon nanowires 35, as seen in FIG. 9b. By way of example, the nanowires 35 may generally have a vertical dimension of less than ten nanometers, as noted above, although larger dimensions may be used in different embodiments. From FIG. 9a it may be seen that at this point in the process, the nanowires 35 are held or suspended in place above the substrate 31 by the spacers 42. More oxide 32 may then be deposited or formed to surround the nanowires 35, as seen in FIGS. 10a and 10b, which may be considered as a dummy oxide spacer (i.e., the gate oxide) for the subsequent gate formation. By way of example, approximately ~5 nm of oxide may be deposited or formed at this point, although other thicknesses may also be used.

Figure 11:
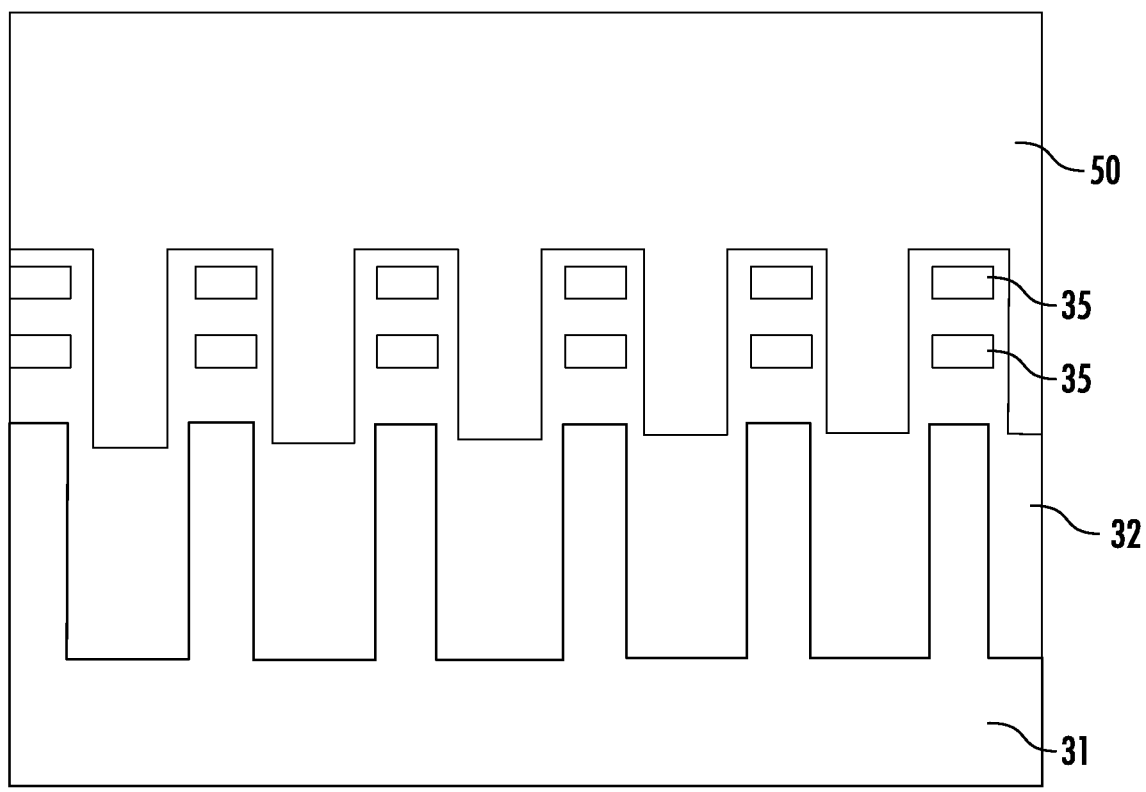
FIG. 11 is a cross-sectional diagram illustrating an intermediate processing step on the gate structure of the semiconductor device of FIG. 1.
Figure 12:
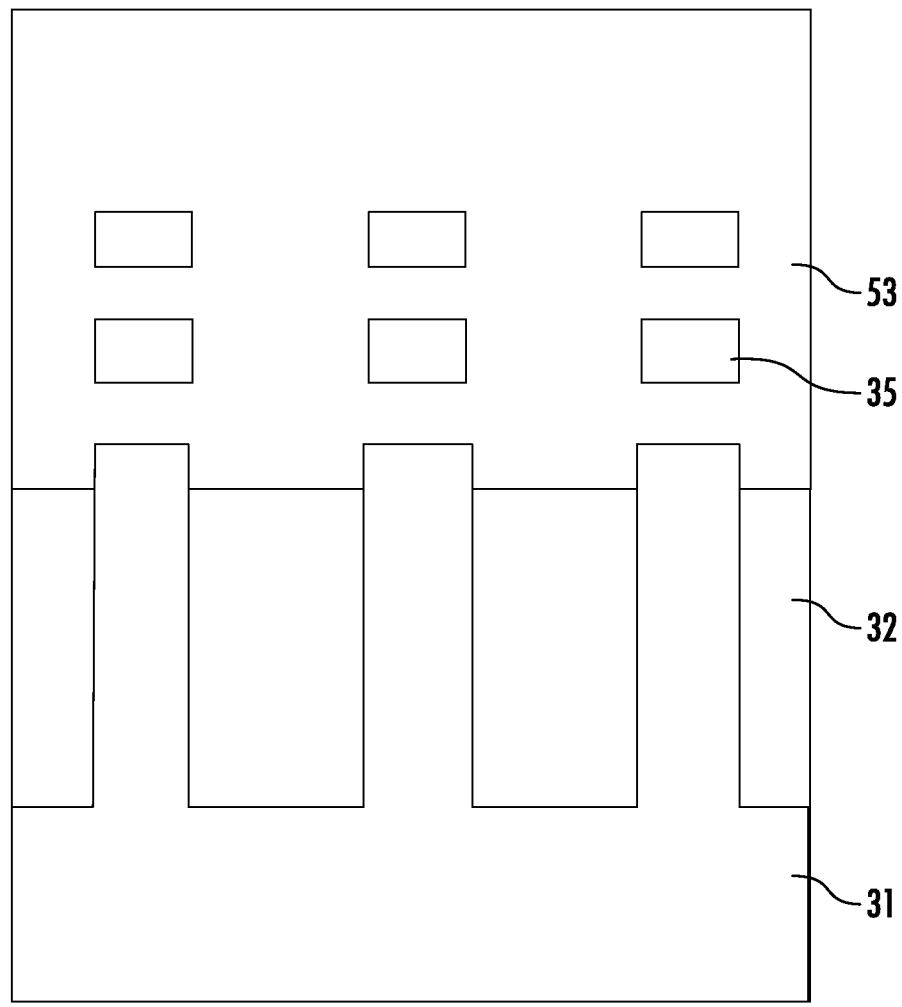
FIG. 12 is a cross-sectional diagram illustrating formation of the raised source (or drain) of the semiconductor device of FIG. 1.

As shown in FIG. 11, a "dummy" gate electrode (e.g., polysilicon) may then be formed over the oxide 32 as part of the RMG formation process, which is subsequently metalized to provide a metal gate electrode 51 (FIG. 14). Outside of the gate area, the dummy oxide may be removed during an epitaxial pre-clean step (e.g., with SiCoNi), after it serves the purpose of protecting the fins/nanowires 35 during gate patterning/spacer formation. The raised source/drain (RSD) epitaxial layer 53 formation is shown in FIG. 12, which in the illustrated example is followed by the formation of the ILD oxide layer 34 (and 38) in FIG. 13, and the RMG formation, as noted above.

The above-described process flow is similar to traditional FINFET processing, which may accordingly provide for a relatively easy use within current generations of FINFET devices, as well as migration to future vertical (or other) transistor devices. Moreover, as noted above, this approach may advantageously allow for the integration of RMG schemes in nanowire transistors, for example.

In view of the above, it will be appreciated that a variety of different transistor structures may be implemented, including but not necessarily limited to: planar CMOS, high-k metal gate CMOS, PD-SOI, FD-SOI, UTBB, vertical double gate, buried gate, FINFET, tri-gate, multi-gate, 2D, 3D, raised source/drain, strained source/drain, strained channel, and combinations/hybrids thereof, for example. Moreover, while fabrication of the semiconductor device 30 has been described herein by way of example as starting from a bulk silicon wafer for the substrate, it will be appreciated that in some embodiments the structure may be fabricated starting with a different type of substrate (e.g., SOI, etc.).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:

forming, on a substrate, at least one stack of alternating first and second semiconductor layers, the first semiconductor layer comprising a first semiconductor material and the second semiconductor layer comprising a second semiconductor material, the first semiconductor material being selectively etchable with respect to the second semiconductor material;

removing portions of the at least one stack and substrate to define exposed sidewalls thereof;

forming respective spacers on the exposed sidewalls;

etching a plurality of recesses through the at least one stack and substrate to define a plurality of spaced apart pillars;

selectively etching the first semiconductor material from the plurality of pillars leaving second semiconductor material structures supported at opposing ends by respective spacers; and forming raised source and drain regions overlying opposing ends of the second semiconductor material structures, and forming at least one gate overlying the second semiconductor material structures between the raised source and drain regions, wherein portions of the substrate beneath the second semiconductor material structures extend vertically upward into the raised source and drain regions and the at least one gate.

2. The method of claim 1 wherein forming the at least one stack comprises forming a plurality thereof.

3. The method of claim 1 wherein each of the second semiconductor material structures has a vertical dimension of less than 10 nanometers.

4. The method of claim 1 further comprising filling at least a portion of the recesses with an oxide prior to selectively etching the first semiconductor material.

5. The method of claim 1 wherein forming the at least one gate comprises forming an insulating layer adjacent the second semiconductor material, and forming a conductor layer adjacent the insulating layer.

6. The method of claim 1 wherein forming the at least one gate comprises forming at least one replacement metal gate (RMG).

7. The method of claim 1 wherein etching comprises forming a mask layer prior to forming the spacers, and removing portions of the mask layer where the recesses are to be etched.

8. The method of claim 1 wherein the first semiconductor material comprises silicon germanium.

9. The method of claim 1 wherein the second semiconductor material comprises silicon.

10. The method of claim 1 wherein the spacers comprise at least one of a nitride and an oxide.

11. The method of claim 1 wherein the substrate comprises silicon.

12. The method of claim 1 wherein said semiconductor device comprises a FINFET.

13. A method for making a semiconductor device comprising:

forming, on a substrate, a plurality of stacks of alternating silicon-germanium and silicon layers;

removing portions of the stacks and substrate to define exposed sidewalls thereof;

forming respective spacers on the exposed sidewalls;

etching a plurality of recesses through the stacks and substrate to define a plurality of spaced apart pillars;

selectively etching the silicon-germanium from the plurality of pillars leaving silicon structures supported at opposing ends by respective spacers; and forming raised source and drain regions overlying opposing ends of the silicon structures, and forming at least one gate overlying the silicon structures between the raised source and drain regions, wherein portions of the substrate beneath the silicon structures extend vertically upward into the raised source and drain regions and the at least one gate.

14. The method of claim 13 wherein each of the silicon structures has a vertical dimension of less than 10 nanometers.

15. The method of claim 13 further comprising filling at least a portion of the recesses with an oxide prior to selectively etching the silicon-germanium.

16. The method of claim 13 wherein forming the at least one gate comprises forming an insulating layer adjacent the second semiconductor material, and forming a conductor layer adjacent the insulating layer.

17. A method for making a semiconductor device comprising:

forming, on a substrate, at least one stack of alternating first and second semiconductor layers, the first semiconductor layer comprising a first semiconductor material and the second semiconductor layer comprising a second semiconductor material, the first semiconductor material being selectively etchable with respect to the second semiconductor material;

patterning the at least one stack to define exposed sidewalls thereof and to define a plurality of spaced apart pillars;

selectively etching at least part of the first semiconductor material from the plurality of pillars leaving second semiconductor material structures supported at opposing ends by respective spacers; and forming raised source and drain regions overlying opposing ends of the second semiconductor material structures, and forming at least one gate overlying the second semiconductor material structures between the raised source and drain regions, wherein portions of the substrate beneath the second semiconductor material structures extend vertically upward into the raised source and drain regions and the at least one gate.

18. The method of claim 17 wherein each of the second semiconductor material structures has a vertical dimension of less than 10 nanometers.

* * * * *